US012349293B2

(12) United States Patent
Huang et al.

(10) Patent No.: US 12,349,293 B2
(45) Date of Patent: Jul. 1, 2025

(54) COMBINED POWER MODULE

(71) Applicant: INDUSTRIAL TECHNOLOGY RESEARCH INSTITUTE, Hsinchu (TW)

(72) Inventors: Yuan-Cheng Huang, New Taipei (TW); I-Hung Chiang, Yuanlin (TW); Ji-Yuan Syu, Kaohsiung (TW); Hsin-Han Lin, Zhudong Township (TW); Po-Kai Chiu, Taoyuan (TW); Kuo-Shu Kao, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 216 days.

(21) Appl. No.: 18/116,763

(22) Filed: Mar. 2, 2023

(65) Prior Publication Data

US 2024/0130055 A1  Apr. 18, 2024

Related U.S. Application Data

(60) Provisional application No. 63/415,953, filed on Oct. 13, 2022.

(30) Foreign Application Priority Data

Dec. 28, 2022  (TW) .................................. 111150256

(51) Int. Cl.
*H05K 5/02*   (2006.01)
*H05K 5/03*   (2006.01)

(52) U.S. Cl.
CPC ............. *H05K 5/0204* (2013.01); *H05K 5/03* (2013.01)

(58) Field of Classification Search
None
See application file for complete search history.

(56) References Cited

U.S. PATENT DOCUMENTS 5,038,197 A * 8/1991 Satriano .................. H01L 23/04
257/691
5,361,189 A * 11/1994 Miyashita ......... H01L 23/49562
257/E23.044

(Continued)

FOREIGN PATENT DOCUMENTS

CN        104078428 A     10/2014
CN        105185750 A     12/2015

(Continued)

OTHER PUBLICATIONS

Taiwan Office Action issued in corresponding application No. 111150256, dated Sep. 14, 2023.

*Primary Examiner* — Xanthia C Relford
(74) *Attorney, Agent, or Firm* — Maschoff Brennan (57) ABSTRACT

This disclosure relates to a combined power module that includes a base structure, a terminal structure, a second terminal, and a cover. The terminal structure includes a mount assembly and a plurality of first terminals. The mount assembly is assembled on the base structure. The first terminals are disposed on the mount assembly. The second terminal is disposed on the base structure. The cover is disposed on the base structure and covers at least part of the first terminals and at least part of the second terminal.

11 Claims, 11 Drawing Sheets

(56) References Cited

U.S. PATENT DOCUMENTS

| | | | |
|---|---|---|---|
| 6,078,501 A * | 6/2000 | Catrambone | H02M 7/003 |
| | | | 174/50.56 |
| D748,595 S | 2/2016 | Bertalan et al. | |
| D790,491 S | 6/2017 | Hayashida et al. | |
| D798,832 S | 10/2017 | Hayashida et al. | |
| 2011/0079413 A1 * | 4/2011 | Masumoto | H02G 3/0675 |
| | | | 174/50 |
| 2012/0256194 A1 * | 10/2012 | Yoshihara | H01L 23/645 |
| | | | 257/77 |
| 2015/0208524 A1 * | 7/2015 | Kontani | H05K 7/14329 |
| | | | 361/752 |
| 2015/0382497 A1 * | 12/2015 | Kawamura | H05K 7/14 |
| | | | 361/728 |
| 2017/0354047 A1 * | 12/2017 | Okura | H05K 5/0247 |
| 2019/0139882 A1 * | 5/2019 | Sato | H02M 7/003 |
| 2020/0323092 A1 | 10/2020 | Williams | |
| 2021/0036457 A1 * | 2/2021 | Aoki | H01R 13/748 |
| 2021/0313243 A1 * | 10/2021 | McPherson | H05K 7/14329 |
| 2022/0132685 A1 * | 4/2022 | Armacost | F21V 23/06 |
| 2022/0337167 A1 * | 10/2022 | Mizuno | H05K 7/1427 |

FOREIGN PATENT DOCUMENTS

| | | |
|---|---|---|
| CN | 108630639 A | 10/2018 |
| CN | 109462375 A | 3/2019 |
| CN | 110400777 A | 11/2019 |
| CN | 113783052 A | 12/2021 |

* cited by examiner

COMBINED POWER MODULE

CROSS-REFERENCE TO RELATED APPLICATIONS

This non-provisional application claims priority under 35 U.S.C. § 119(a) on Patent Application Nos. 63/415,953 filed in U.S.A on Oct. 13, 2022 and Patent Application No(s). 111150256 filed in Taiwan, R.O.C. on Dec. 28, 2022, the entire contents of which are hereby incorporated by reference.

TECHNICAL FIELD

The present disclosure relates to a power module, more particularly to a combined power module.

BACKGROUND

A power module provides may encloses several power components therein, where power components may be power semiconductor devices and are fixed on a substrate typically by soldering or sintering. The power components may provide electrical contact or electrical insulation as required. Compared to discrete power semiconductors, power module is able to reliably provide a higher power density and are in many cases more reliable.

At the present, the housing of the power module is designed as one-piece through injection molding. However, in the case that the power module needs to be designed in a more complex or larger structure, the one-piece design may cause difficulty in injection materials and incomplete molding of the housing. Further, it is necessary to place a metal terminal into the mold during molding of the housing, so that the arrangement of the metal terminal can be done with the molding of the housing. However, if the molding fails, the molding materials on the metal terminal needs to be removed to be used again, which wasting manufacturing time. In order to save the removal time on the used metal terminal, a new metal terminal may be used for the arrangement in the next molding, but the manufacturing cost is still increased. Furthermore, the combined power module may be need to be designed in different size in different application. However, it is necessary to build new mold for each size of the combined power module, which also increases the manufacturing cost.

SUMMARY

The present disclosure provides a combined power module with high expansibility.

According to one aspect of the present disclosure, a combined power module includes a base structure, a terminal structure, a second terminal, and a cover. The terminal structure includes a mount assembly and a plurality of first terminals. The mount assembly is assembled on the base structure. The first terminals are disposed on the mount assembly. The second terminal is disposed on the base structure. The cover is disposed on the base structure and covers at least part of the first terminals and at least part of the second terminal.

According to the combined power module discussed above, the design that the terminal structure is detachably assembled to the base structure makes the combined power module a combination of separately designed pieces. This is favorable for preventing complex design for each piece and thereby improving the yield rate of molding or manufacturing. In addition, the installation of the first terminals of the terminal structure is after the formation of the mount assembly, thus the failure of the formation of the mount assembly does not affect the cost of cleaning or replacing the first terminals. Moreover, to adapt the size of several components of the base structure, it only needs to replace the first terminals for the mount assembly but has no need to redesign and produce a new mount assembly. This is favorable for saving manufacturing cost and improving the expansibility of the combined power module. As such, by replacing the first terminal and second terminal of required length and shape, it is easily to realize various configurations of the combined power module while keeping using the same mount assembly. That is, the cost related to redesigning the mount assembly is prevented when facing different application requirements of the combined power module.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
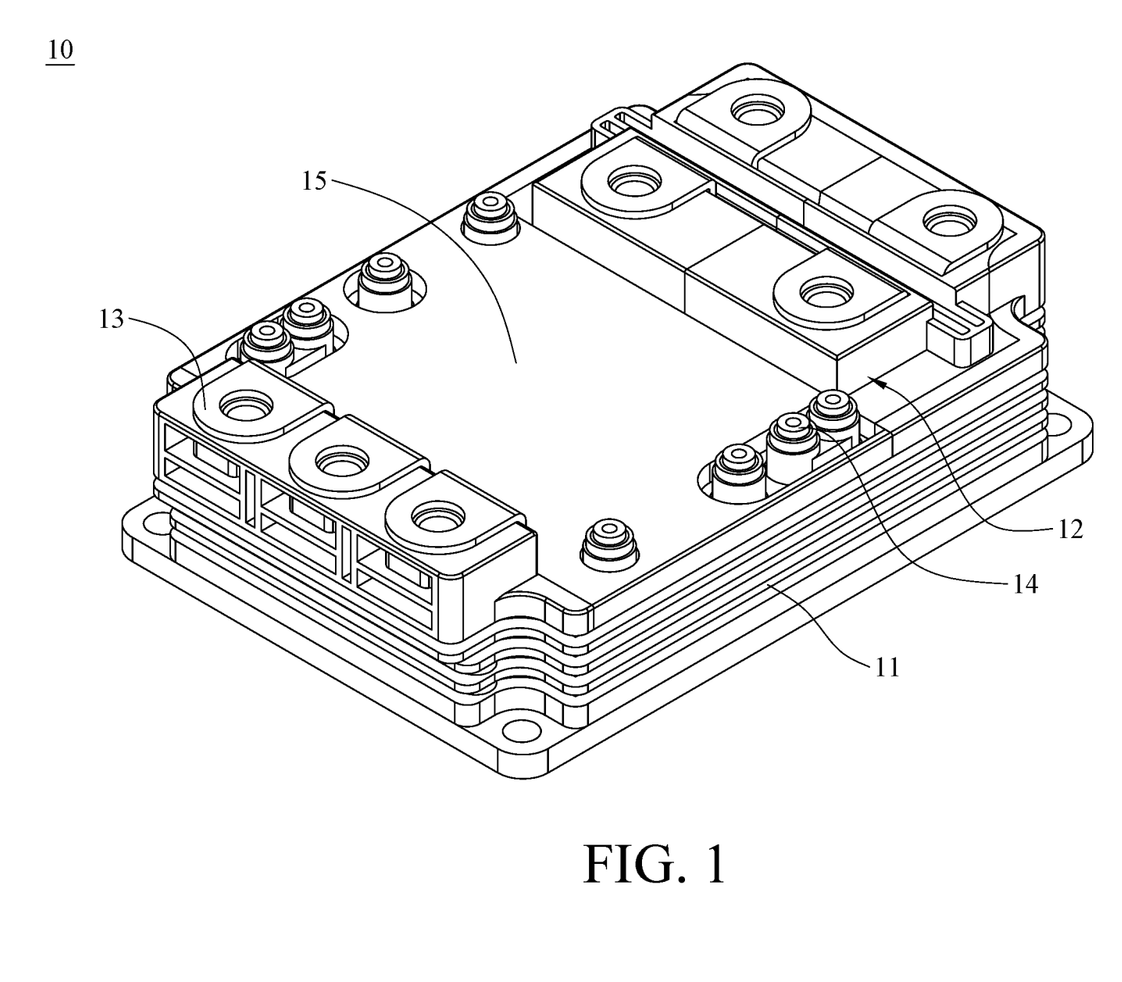
FIG. 1 is a perspective view of a combined power module according to one embodiment of the present disclosure.
Figure 2:
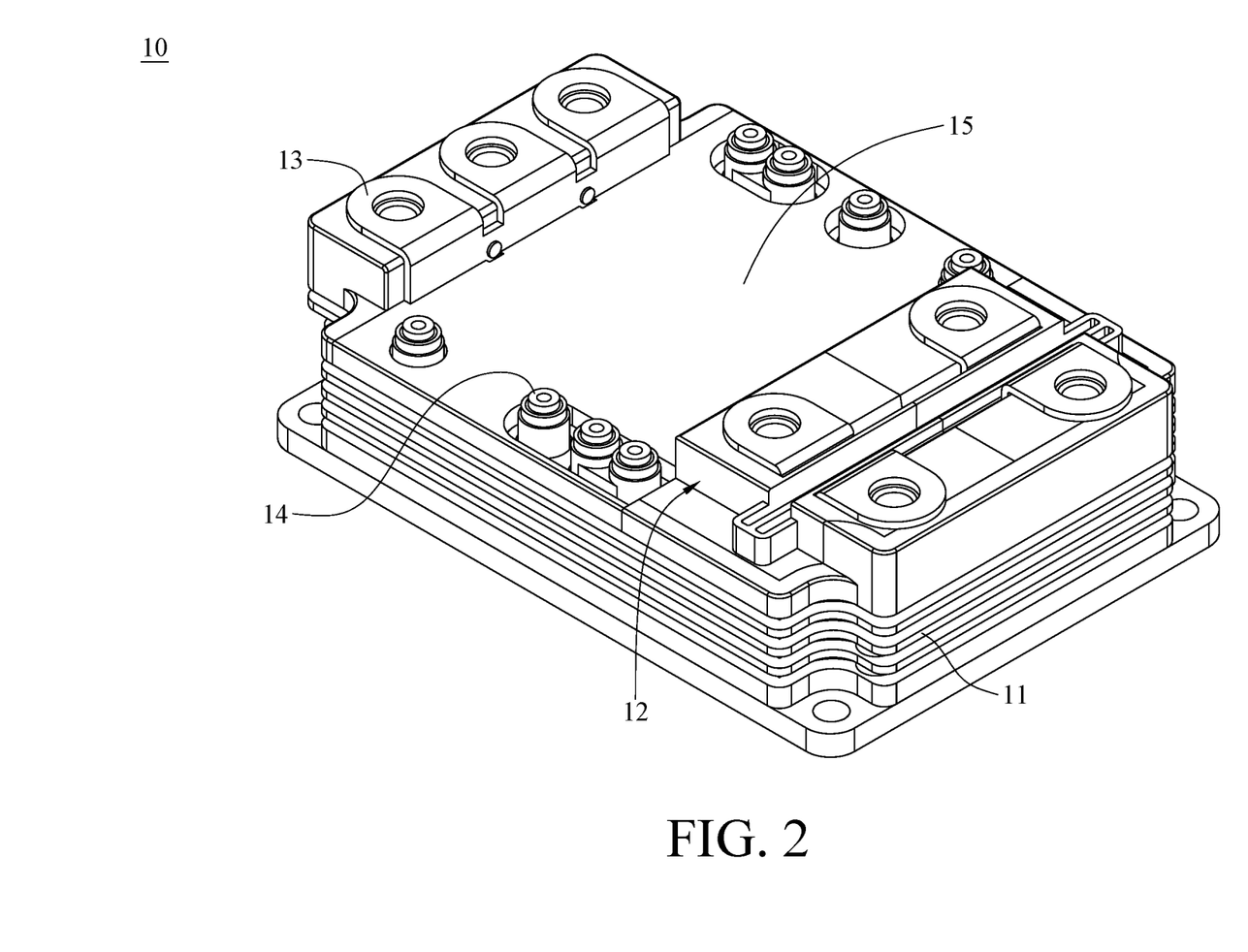
FIG. 2 is another perspective view of the combined power module in FIG. 1.
Figure 3:
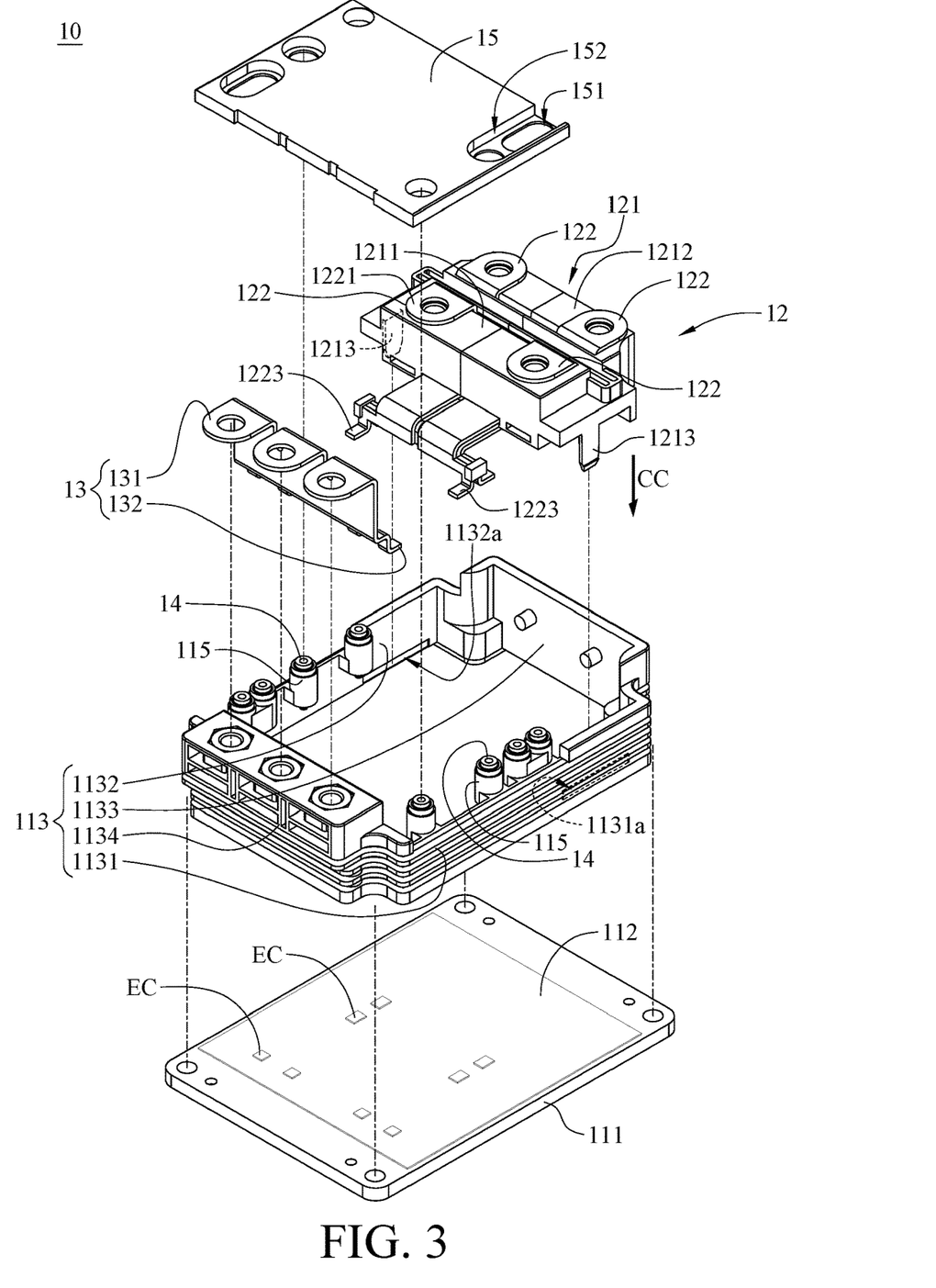
FIG. 3 is an exploded view of the combined power module in FIG. 1.
Figure 4:
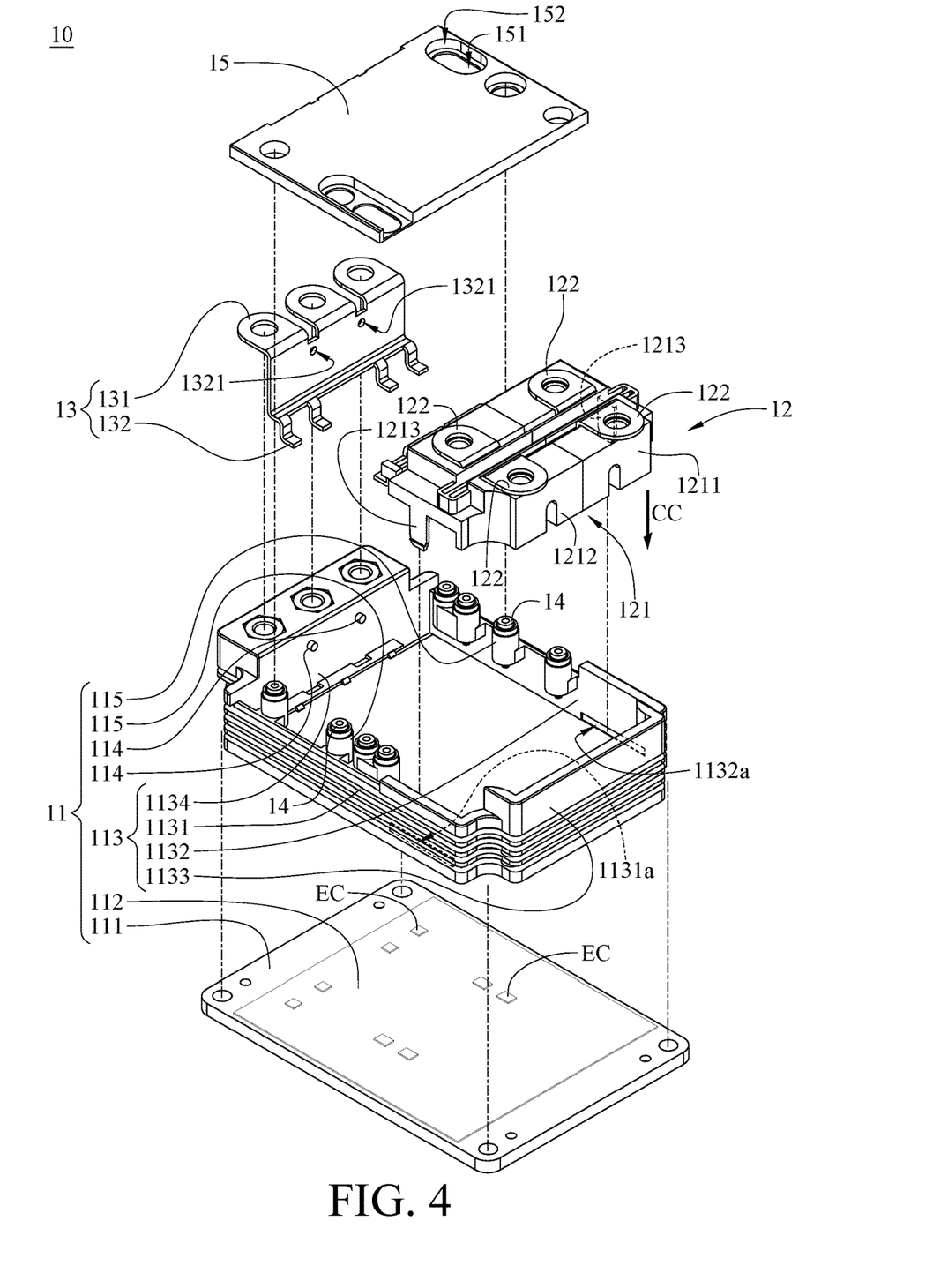
FIG. 4 is an exploded view of the combined power module in FIG. 2.
Figure 5:
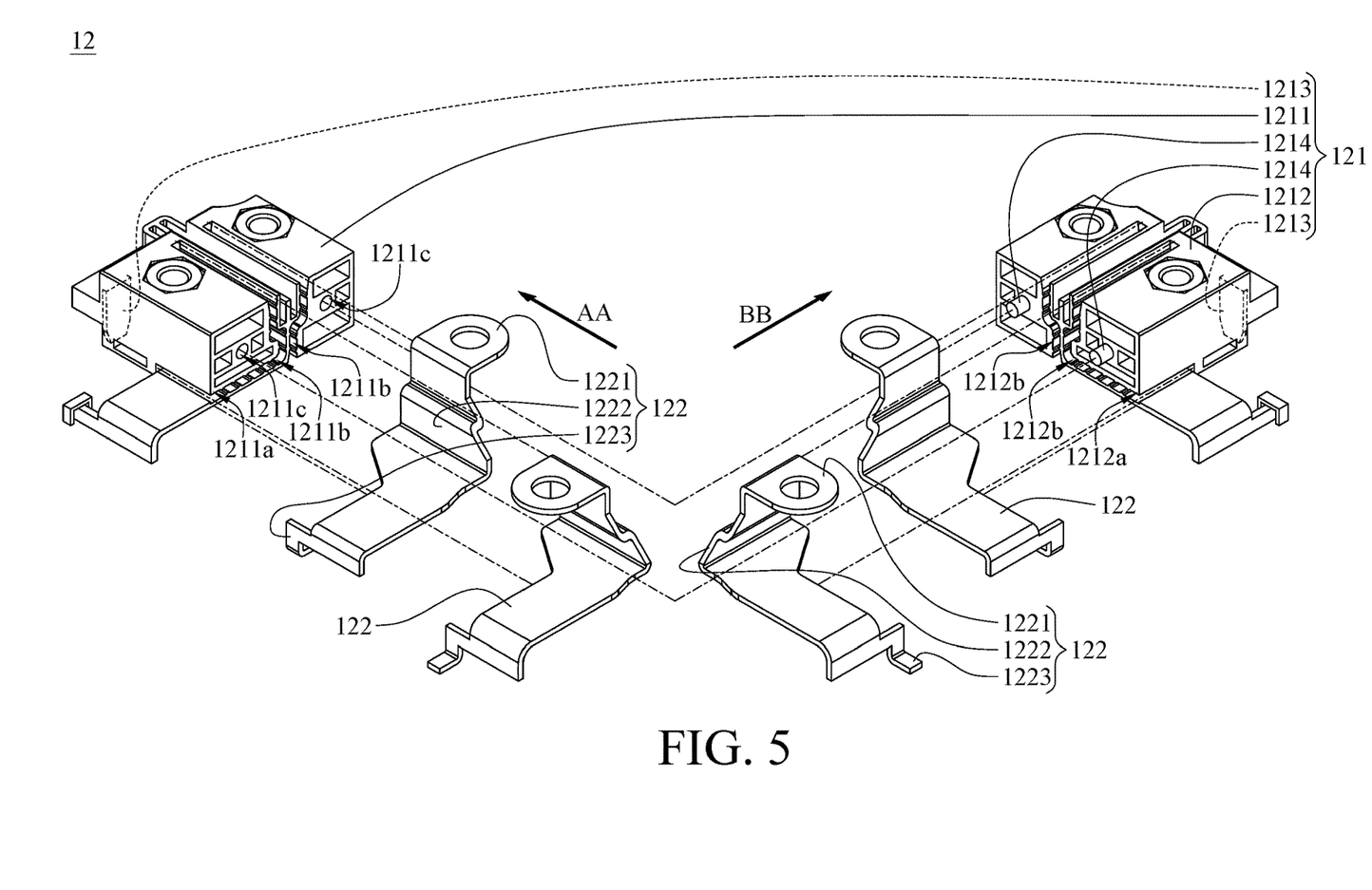
FIG. 5 is an exploded view of a terminal structure of the combined power module in FIG. 3.

Please refer to FIG. 1 to FIG. 5, where FIG. 1 is a perspective view of a combined power module according to one embodiment of the present disclosure, FIG. 2 is another perspective view of the combined power module in FIG. 1, FIG. 3 is an exploded view of the combined power module in FIG. 1, FIG. 4 is an exploded view of the combined power module in FIG. 2, and FIG. 5 is an exploded view of a terminal structure of the combined power module in FIG. 3.

A combined power module 10 provided in one embodiment of the present disclosure may be applied to high-voltage rail vehicles such as high-speed trains. The combined power module 10 includes a base structure 11, a terminal structure 12, a second terminal 13, a plurality of signal terminals 14, and a cover 15.

The base structure 11 includes a bottom plate 111, a substrate 112, a surrounding wall 113, a plurality of positioning posts 114, and a plurality of installation posts 115. The substrate 112 is disposed on the bottom plate 111 and has a plurality of electric components EC (e.g., power chips) disposed thereon.

The surrounding wall 113 stands on the bottom plate 111 and surrounds the substrate 112. The surrounding wall 113 includes a first lateral wall 1131, a second lateral wall 1132, a third lateral wall 1133, and a fourth lateral wall 1134. The first lateral wall 1131 and the second lateral wall 1132 are located opposite to each other. The third lateral wall 1133 and the fourth lateral wall 1134 are located opposite to each other and are located between the first lateral wall 1131 and the second lateral wall 1132. The first lateral wall 1131 may have an engagement groove 1131a at a side thereof which is located close to the third lateral wall 1133. The second lateral wall 1132 may have an engagement groove 1132a at a side thereof which is located close to the third lateral wall 1133.

The positioning posts 114 are disposed on a surface of the fourth lateral wall 1134 facing towards the third lateral wall 1133 and extend towards the third lateral wall 1133, as shown in FIG. 4. The installation posts 115 are disposed on surfaces of the first lateral wall 1131 and the second lateral wall 1132 facing towards each other and extend along a direction perpendicular to the bottom plate 111.

The terminal structure 12 includes a mount assembly 121 and four first terminals 122. The mount assembly 121 includes a first main part 1211, a second main part 1212, two engagement hooks 1213, and a plurality of protruded parts 1214. The first main part 1211 has a contact surface 1211a, two accommodation slots 1211b, and a plurality of recessed parts 1211c. The accommodation slots 1211b extend to the contact surface 1211a and are exposed to outside. The recessed parts 1211c may be circular blind holes and are recessed from the contact surface 1211a of the first main part 1211. The second main part 1212 has a contact surface 1212a and two accommodation slots 1212b. The accommodation slots 1212b extend to the contact surface 1212a and are exposed to outside. The engagement hooks 1213 are respectively connected to the first main part 1211 and the second main part 1212. The protruded parts 1214 may be cylindrical posts and protrude from the contact surface 1212a of the second main part 1212. The protruded parts 1214 may be slightly larger than the recessed parts 1211c or may substantially have the same size as the recessed parts 1211c.

Each first terminal 122 includes a connection portion 1221, a bent portion 1222, and a leg portion 1223. The bent portion 1222 is connected to and located between the connection portion 1221 and the leg portion 1223. The bent portion 1222 may match the accommodation slot 1211b or 1212b in shape.

The details of the terminal structure 12 are illustrated with reference to FIG. 5. As shown, the bent portions 1222 of the first terminals 122 may be placed into corresponding accommodation slots 1211b and 1212b via the contact surface 1211a of the first main part 1211 and the contact surface 1212a of the second main part 1212 along directions AA and BB. Then, the contact surface 1211a of the first main part 1211 and the contact surface 1212a of the second main part 1212 are placed face to face to allow the insertion of the protruded parts 1214 into the recessed parts 1211c along a direction perpendicular to the contact surfaces 1211a and 1212a. By doing so, the second main part 1212 is detachably connected to the first main part 1211. Then, as shown in FIG. 3 and FIG. 4, the assembled first main part 1211 and second main part 1212 may be moved towards the bottom plate 111 along a direction CC so as to cause the engagement hooks 1213 to engage with the engagement grooves 1131a and 1132a, realizing the engagement between the mount assembly 121 and the sides of the first lateral wall 1131 and the second lateral wall 1132 which are located close to the third lateral wall 1133. As such, the terminal structure 12 and the base structure 11 are firmly assembled to each other. The leg portions 1223 may contact the substrate 112 when the terminal structure 12 is assembled to the base structure 11. Optionally, the leg portions 1223 may be fixed to the substrate 112 by, for example, ultrasonic welding. In some other embodiments of the present disclosure, at least one of the leg portions may directly contact electric components on the substrate when the terminal structure is assembled to the base structure for forming an electric connection between the leg portions and the electric components.

The second terminal 13 has a plurality of connection portions 131 and a leg portion 132 connected to the connection portions 131, as shown in FIG. 4. The leg portions 132 have a plurality of positioning holes 1321 configured for the insertion of the positioning posts 114 when the second terminal 13 is installed on the fourth lateral wall 1134.

The arrangement of the signal terminals 14 in the installation posts 115 may be realized by placing the signal terminals 14 into mold cavities during the injection molding of the installation posts 115. The signal terminals 14 are provided for transmitting signals.

The cover 15 has a plurality of installation holes 151. Parts of the installation holes 151 may be slightly smaller than the installation posts 115 or substantially have the same size as the installation posts 115. When the installation posts 115 are inserted into the installation holes 151, the cover 15 is firmly disposed on a side of the surrounding wall 113 located away from the bottom plate 111. When the cover 15 is installed on the surrounding wall 113, the cover 15 is located between the connection portions 1221 of the first terminals 122 and the connection portions 131 of the second terminal 13 and covers the leg portions 1223 of the first terminals 122 and the leg portions 132 of the second terminal 13, and the signal terminals 14, the connection portion 1221 of the first terminals 122, and the connection portions 131 of the second terminal 13 are not covered and therefore are exposed to outside.

The first terminals 122 and the second terminal 13 can be served as input or output terminals to allow electrical connection with external component. For example, the first terminal 122 or the second terminal 13 may be employed as a positive DC terminal, a negative DC terminal, or an AC terminal, and the present disclosure is not limited thereto.

The design that the terminal structure 12 is detachably assembled to the base structure 11 and the mount assembly 121 of the terminal structure 12 is an assembly of several pieces makes the combined power module 10 a combination of separately designed pieces. This is favorable for preventing complex design for each piece and thereby improving the yield rate of molding or manufacturing. In addition, the installation of the first terminals 122 of the terminal structure 12 is after the formation of the mount assembly 121, thus the failure of the formation of the mount assembly 121 does not affect the cost of cleaning or replacing the first terminals 122. Moreover, to adapt the size of the substrate 112 and the arrangement of the electric components EC on the substrate 112, it only needs to replace the first terminals 122 for the mount assembly 121 but has no need to redesign and produce a new mount assembly. This is favorable for saving manufacturing cost and improving the expansibility of the combined power module 10. As such, by replacing the first terminal 122 and second terminal 13 with those having leg portions 1223 and 132 of required length and shape, it is easily to realize various configurations of the combined power module 10 while keeping using the same mount assembly 121. That is, the cost related to redesigning the mount assembly 121 is prevented when facing different application requirements of the combined power module 10.

Optionally, before the installation of the cover 15, a filler (not shown) may be applied to the inner space surrounded by the surrounding wall 113 to protect components such as the electric components EC. The filler may be made of silicone or epoxy.

Optionally, the cover 15 may further include a plurality of enlargement holes 152 connected to the installation holes 151. The enlargement holes 152 are larger than the installation holes 151. The installation posts 115 can be inserted into the installation holes 151 and the enlargement holes 152 at the same time. The installation posts 115 may not in direct contact with the surfaces that define the enlargement holes 152. In the case that the cover 15 is made of plastic material, the cover 15 may be polarized due to high voltage applied to the combined power module 10. The present of the enlargement holes 152 increases the signal transmission distance between the signal terminals 14 on the electrically insulating surface of the cover 15, where the signal transmission distance is also known as "creepage distance". As such, the areas of the cover 15 between the signal terminals 14 is prevented from polarized, thereby preventing signal interference from existing between signal terminals 14 due to an electrical connection therebetween.

Please be noted that the locations of the engagement grooves 1131a and 1132a may be modified as required. In some other embodiments, the engagement grooves may be disposed on any required areas of the first lateral wall and the second lateral wall, or even on the third lateral wall.

Figure 6:
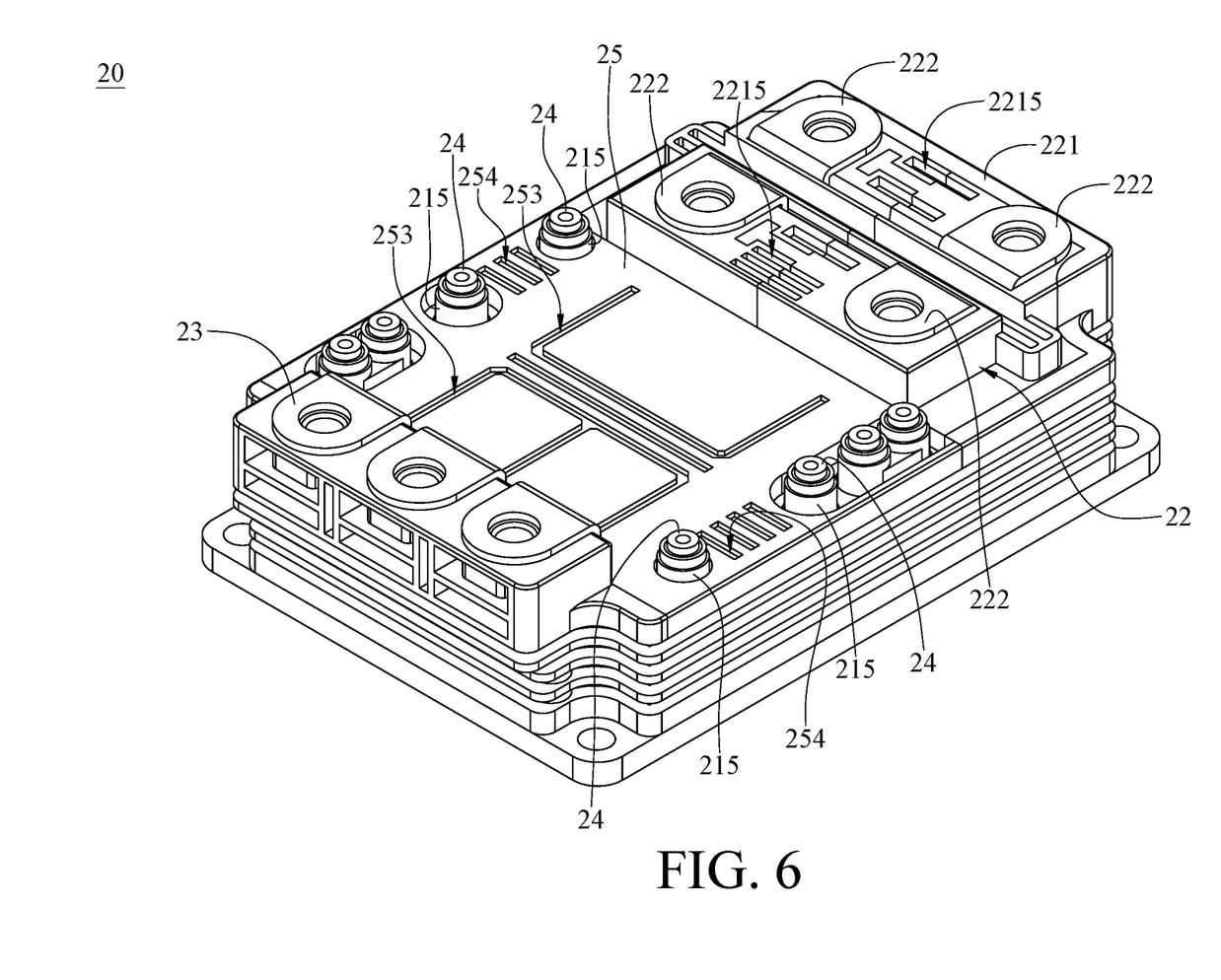
FIG. 6 is a perspective view of a combined power module according to another embodiment of the present disclosure.

Please refer FIG. 6, which is a perspective view of a combined power module 20 according to another embodiment of the present disclosure. The combined power module 20 provided in another embodiment of the present disclosure is similar to the combined power module 10 in the abovementioned embodiment in structure. For simplicity, only differences between the combined power module 20 and the combined power module 10, as well as necessary description, will be illustrated hereinafter.

In the combined power module 20, the cover 25 may further have a plurality of first trenches 253 located between the first terminals 222 and the second terminal 23. Therefore, the signal transmission distance between the first terminals 222 and the second terminal 23 on the electrically insulating surface of the cover 25 (the creepage distance) can be increased to prevent polarization of the cover 25 between the first terminals 222 and the second terminal 23, thereby preventing an electrical connection between the first terminals 222 and the second terminal 23.

In the combined power module 20, the mount assembly 221 may have a plurality of second trenches 2215 located between the first terminals 222. Therefore, the signal transmission distance between the first terminals 222 on the electrically insulating surface of the mount assembly 221 (the creepage distance) can be increased to prevent polarization of the mount assembly 221 between the first terminals 222, thereby preventing an electrical connection between the first terminals 222.

In the combined power module 20, the cover 25 may further have a plurality of third trenches 254 located between the signal terminals 24 disposed on the installation posts 215. Therefore, the signal transmission distance between the signal terminals 24 on the electrically insulating surface of the cover 25 (the creepage distance) can be increased to prevent polarization of the cover 25 between the signal terminals 24, thereby further preventing signal interference from existing between signal terminals 24 due to an electrical connection therebetween.

Figure 7:
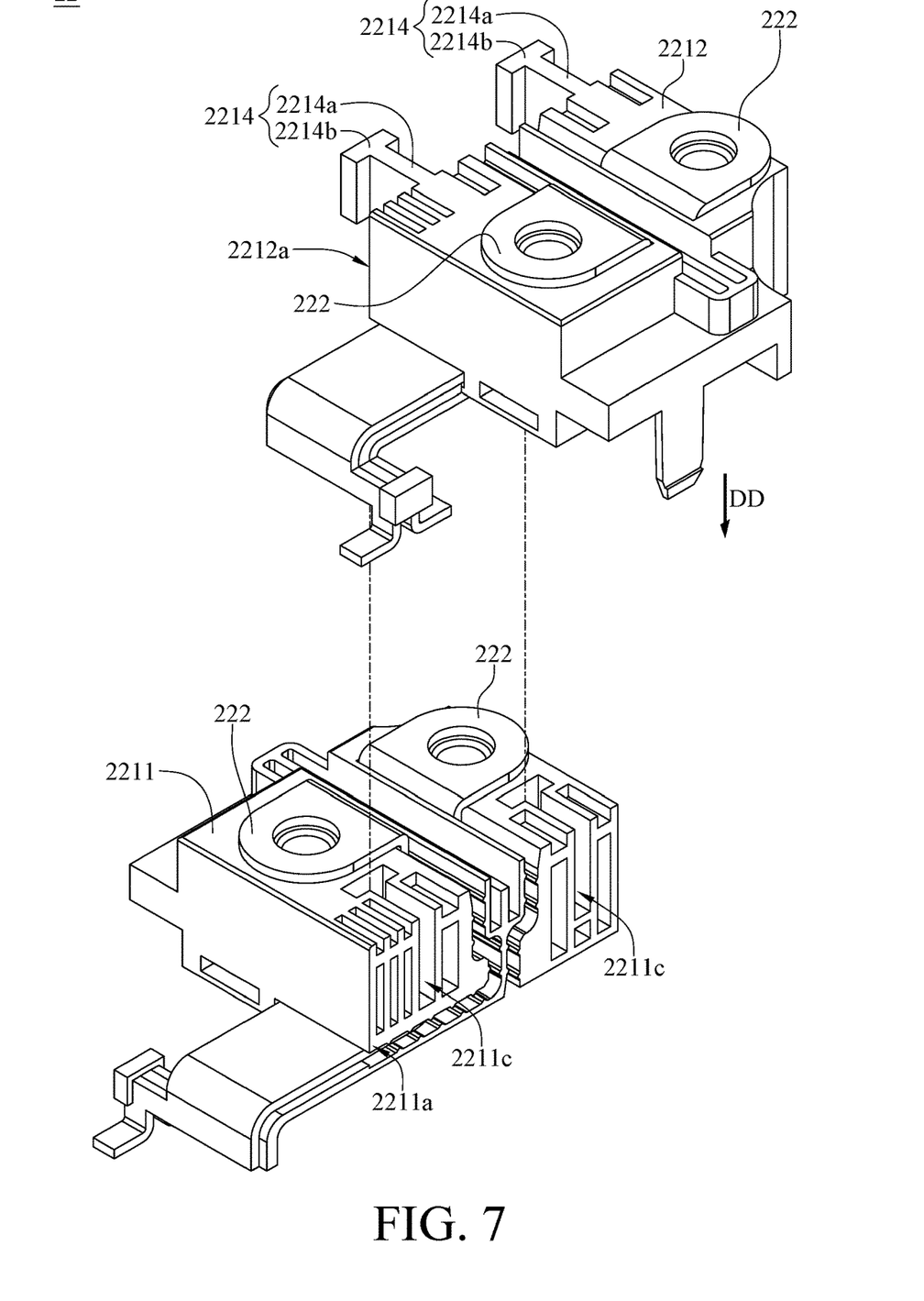
FIG. 7 is an exploded view of a terminal structure of the combined power module in FIG. 6.

In this embodiment, the assembly manner of the first main part 2211 and the second main part 2212 of the combined power module 20 is different from that of the combined power module 10. Please refer to FIG. 7 together, where FIG. 7 is an exploded view of a terminal structure 22 of the combined power module 20 in FIG. 6.

As shown, each protruded part 2214 includes a first extension portion 2214a and a second extension portion 2214b. The first extension portion 2214a is connected to and located between the second main part 2212 and the second extension portions 2214b, and an extension direction of the first extension portion 2214a is different from an extension direction of the second extension portion 2214b. Each protruded part 2214 may have a T-shape. The protruded parts 2214 may fit the recessed parts 2211c of the first main part 2211 in shape to allow the insertion of the protruded parts 2214 into the recessed parts 2211c along a direction DD, where the direction DD is parallel to extension directions of the contact surfaces 2211a and 2212a, after the first terminals 222 are disposed on the first main part 2211 and the second main part 2212. As such, the second main part 2212 is detachably assembled to the first main part 2211.

Please be noted that the circular recessed parts 1211c and the cylindrical protruded parts 1214 of the combined power module 10 in the abovementioned embodiment are not intended to restrict the present disclosure. Please refer to FIG. 8, which is an exploded view of a terminal structure of a combined power module 30 according to further another embodiment of the present disclosure. The combined power module 30 provided in further another embodiment of the present disclosure is similar to the combined power module 10 in the abovementioned embodiment in structure. For simplicity, only differences between the combined power module 30 and the combined power module 10, as well as necessary description, will be illustrated hereinafter.

Figure 8:
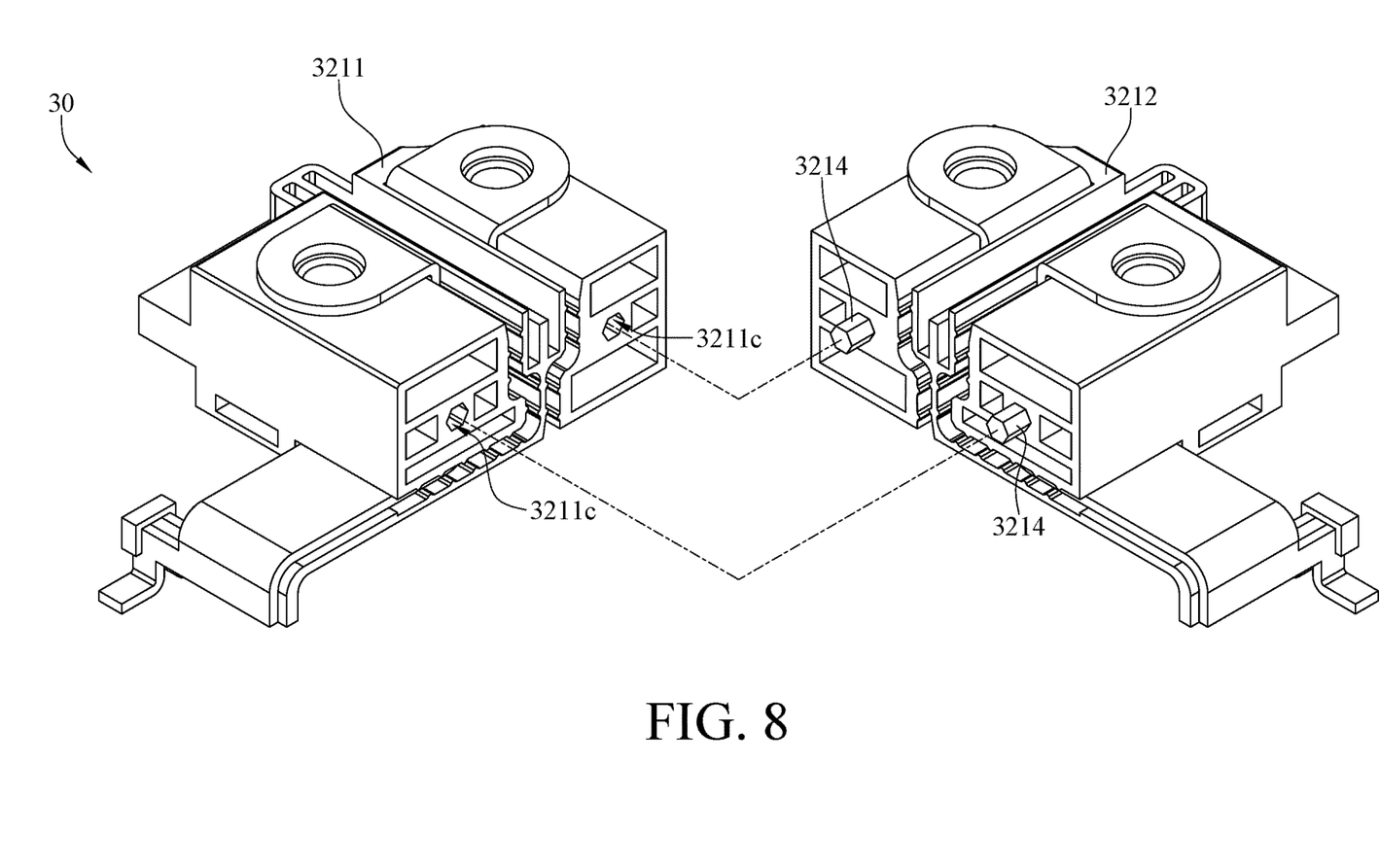
FIG. 8 is an exploded view of a terminal structure of a combined power module according to further another embodiment of the present disclosure.

In the combined power module 30, the recessed parts 3211c of the first main part 3211 may be hexagonal blind holes, and the protruded parts 3214 disposed on the second main part 3212 may be hexagonal posts.

Please be noted that the engagement hook 1213 and the engagement grooves 1131a and 1132a of the combined power module 10 in the abovementioned embodiment are not intended to restrict the present disclosure. Please refer to FIG. 9, which is an exploded view of a combined power module 40 according to still further another embodiment of the present disclosure. The combined power module 40 provided in still further another embodiment of the present disclosure is similar to the combined power module 10 in the abovementioned embodiment in structure. For simplicity, only differences between the combined power module 40 and the combined power module 10, as well as necessary description, will be illustrated hereinafter.

Figure 9:
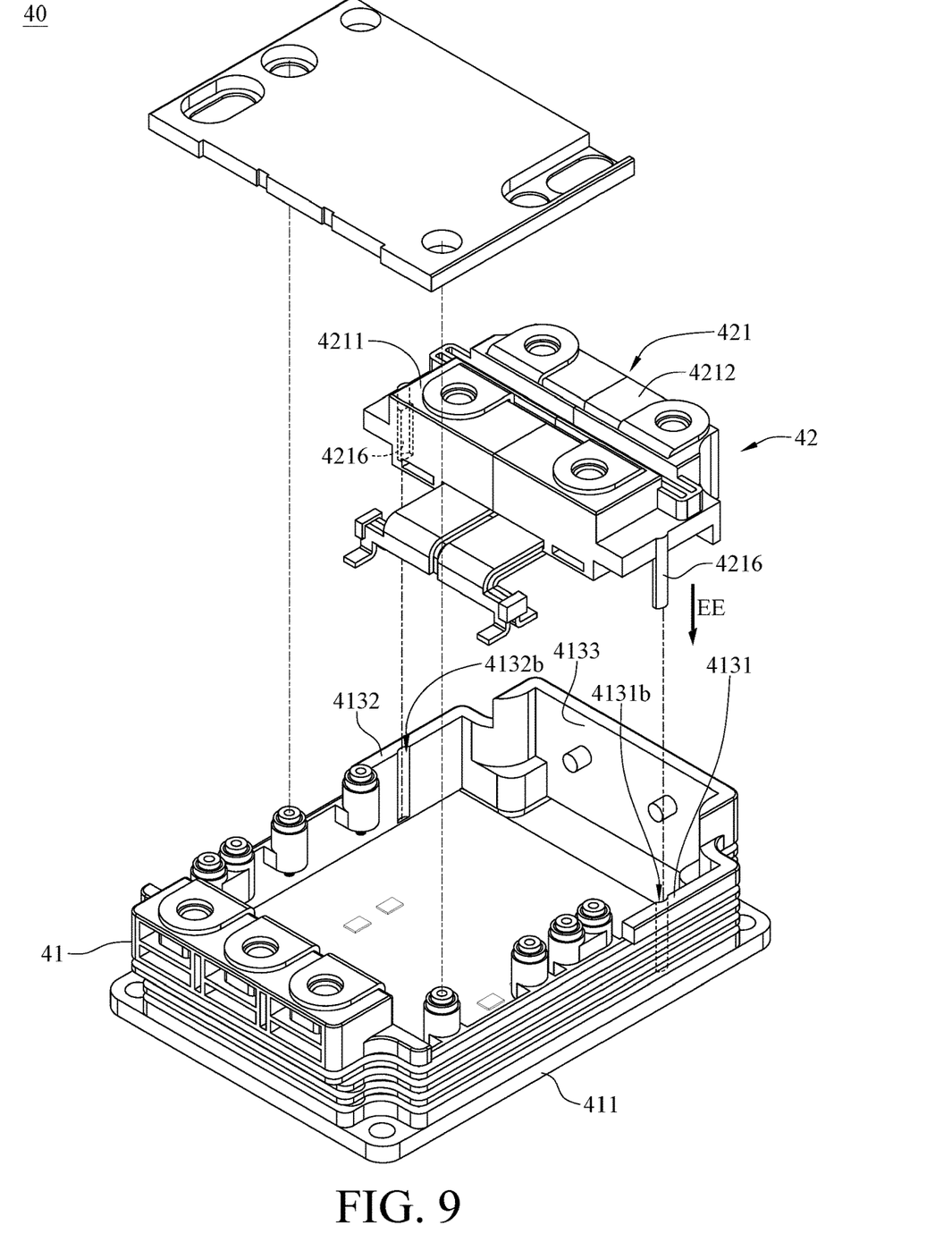
FIG. 9 is an exploded view of a combined power module according to still further another embodiment of the present disclosure.

In the combined power module 40, the first lateral wall 4131 may have an assemble groove 4131b at a side thereof which is located close to the third lateral wall 4133, and the second lateral wall 4132 may have an assemble groove 4132b at a side thereof which is located close to the third lateral wall 4133. Extension directions of the assemble grooves 4131b and 4132b may be perpendicular to the bottom plate 411. The mount assembly 421 may include two assemble protrusions 4126 respectively connected to the first main part 4122 and the second main part 4212. The assemble protrusions 4216 may be slightly larger than the assemble grooves 4131b and 4132b or may be have the same size as the assemble grooves 4131b and 4132b. Therefore, the terminal structure 42 may be moved towards the bottom plate 411 along a direction EE, as shown in FIG. 9, to tightly insert the assemble protrusions 4216 into the assemble grooves 4131b and 4132b, such that the mount assembly 421 is disposed at sides of the first lateral wall 4131 and the second lateral wall 4132 which are located close to the third lateral wall 4133, such that the terminal structure 42 is assembled to the base structure 41.

Please be noted that the connection portions 1221 and 131 with curved corners of the combined power module 10 in the abovementioned embodiment are not intended to restrict the present disclosure. Please refer to FIG. 10, which is a perspective view of a combined power module 50 according to still further another embodiment of the present disclosure. The combined power module 50 provided in still further another embodiment of the present disclosure is similar to the combined power module 10 in the abovementioned embodiment in structure. For simplicity, only differences between the combined power module 50 and the combined power module 10, as well as necessary description, will be illustrated hereinafter.

Figure 10:
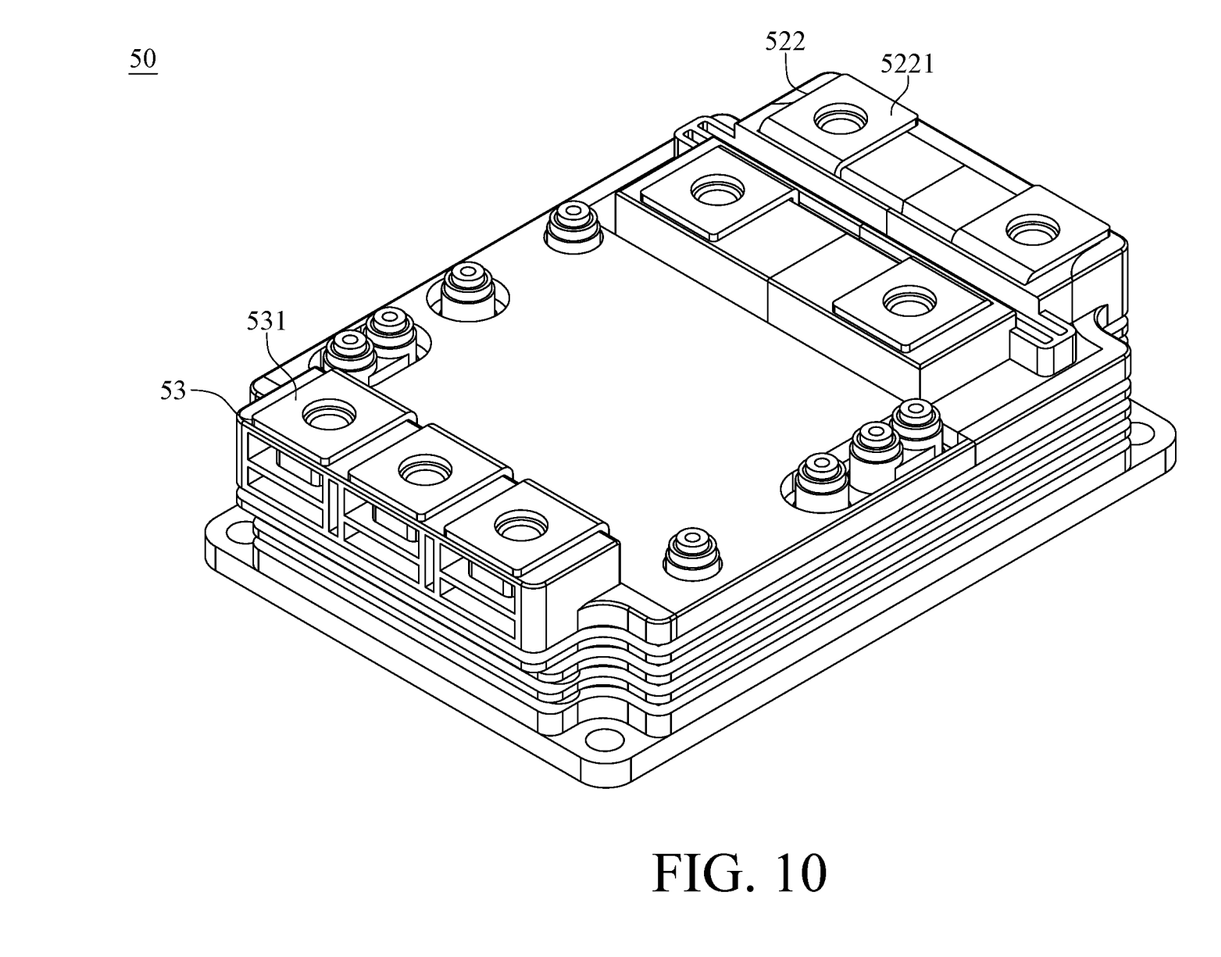
FIG. 10 is a perspective view of a combined power module according to still further another embodiment of the present disclosure.

In the combined power module 50, the connection portions 5221 of the first terminals 522 and the connection portions 531 of the second terminal 53 may have rectangular shapes.

Please be noted that the connection portions 1221 and 131 with curved corners of the combined power module 10 in the abovementioned embodiment are not intended to restrict the present disclosure. Please refer to FIG. 11, which is a perspective view of a combined power module 60 according to still further another embodiment of the present disclosure. The combined power module 60 provided in still further another embodiment of the present disclosure is similar to the combined power module 10 in the abovementioned embodiment in structure. For simplicity, only differences between the combined power module 60 and the combined power module 10, as well as necessary description, will be illustrated hereinafter.

Figure 11:
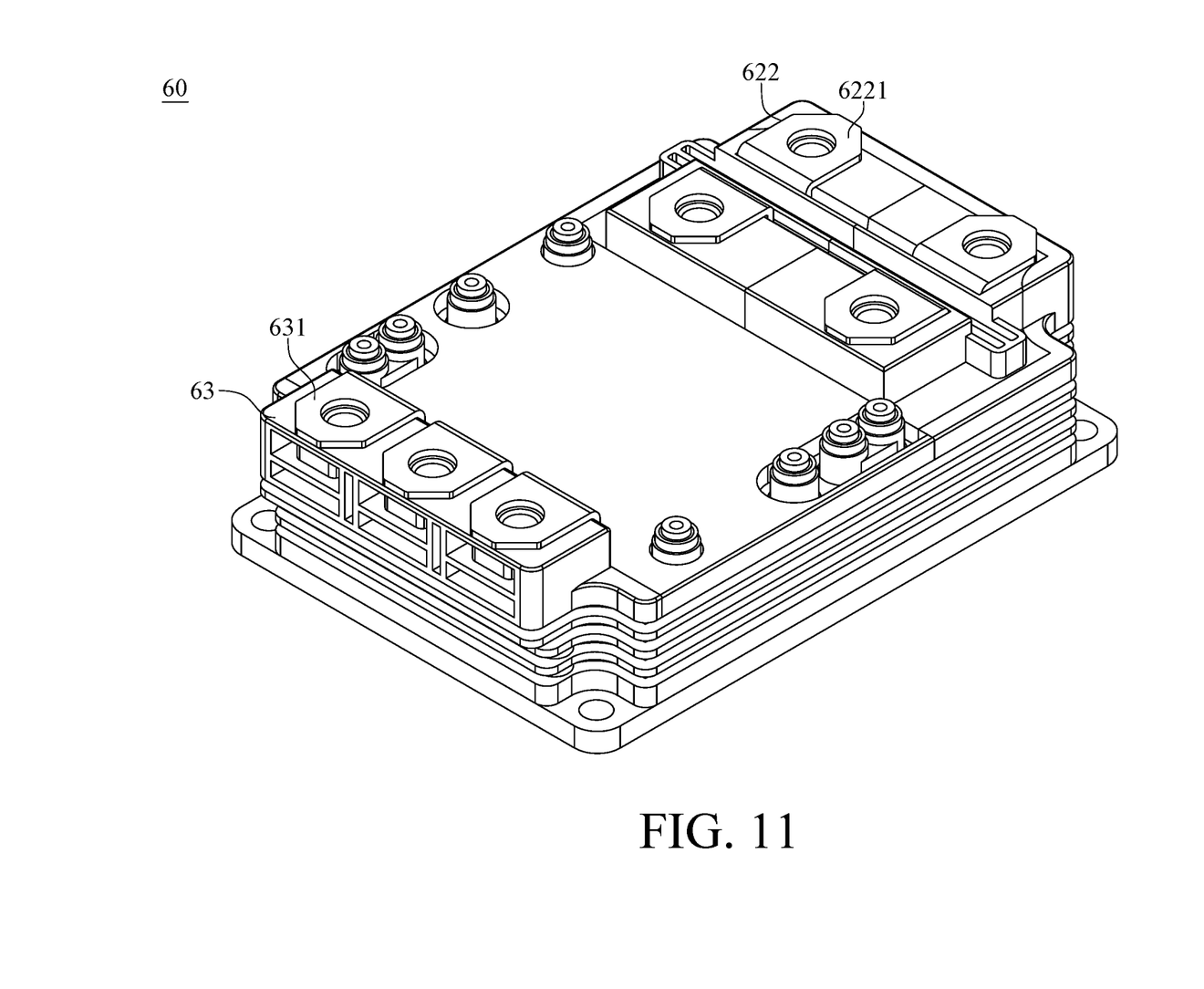
FIG. 11 is a perspective view of a combined power module according to still further another embodiment of the present disclosure.

In the combined power module 60, the connection portions 6221 of the first terminals 622 and the connection portions 631 of the second terminal 63 may have chamfers at sides away from each other rather than simple rectangles so as to enhance the appearance recognizability of the combined power module 60.

According to the combined power module discussed above, the design that the terminal structure is detachably assembled to the base structure and the mount assembly of the terminal structure is an assembly of several pieces makes the combined power module a combination of separately designed pieces. This is favorable for preventing complex design for each piece and thereby improving the yield rate of molding or manufacturing. In addition, the installation of the first terminals of the terminal structure is after the formation of the mount assembly, thus the failure of the formation of the mount assembly does not affect the cost of cleaning or replacing the first terminals. Moreover, to adapt the size of the substrate and the arrangement of the electric components on the substrate, it only needs to replace the first terminals for the mount assembly but has no need to redesign and produce a new mount assembly. This is favorable for saving manufacturing cost and improving the expansibility of the combined power module. As such, by replacing the first terminal and second terminal with those having leg portions and of required length and shape, it is easily to realize various configurations of the combined power module while keeping using the same mount assembly. That is, the cost related to redesigning the mount assembly is prevented when facing different application requirements of the combined power module.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A combined power module, comprising:
  a base structure, having an assemble groove;
  a terminal structure, comprising:
    a mount assembly, assembled on the base structure, wherein the mount assembly comprises:
      at least one main part; and
      at least one assemble protrusion, connected to the at least one main part;
    wherein the mount assembly is disposed on the base structure through the at least one assemble protrusion tightly inserted into the assemble groove; and
    a plurality of first terminals, disposed on the mount assembly;
  a second terminal, disposed on the base structure; and
  a cover, disposed on the base structure and covering at least part of the plurality of first terminals and at least part of the second terminal.

2. A combined power module comprising:
  a base structure, having an engagement groove;
  a terminal structure, comprising:
    a mount assembly, assembled on the base structure, wherein the mount assembly comprises:
      at least one main part; and
      at least one engagement hook, connected to the at least one main part;
    wherein the mount assembly is engaged with the base structure through the at least one engagement hook hooked on the engagement groove; and
    a plurality of first terminals, disposed on the mount assembly;
  a second terminal, disposed on the base structure; and a cover, disposed on the base structure and covering at least part of the plurality of first terminals and at least part of the second terminal.

3. The combined power module according to claim 2, wherein the mount assembly further comprises a protruded part, a quantity of the at least one main part is two, the two main parts comprise a first main part and a second main part, the first main part has a recessed part, the protruded part is connected to the second main part, and the second main part is detachably disposed on the first main part through the protruded part assembled into the recessed part.

4. The combined power module according to claim 3, wherein the protruded part comprises a first extension portion and a second extension portion, the first extension portion is connected to and located between the second main part and the second extension portion, and an extension direction of the first extension portion is different from an extension direction of the second extension portion.

5. A combined power module, comprising:
a base structure, comprising a bottom plate, a substrate, and a surrounding wall, wherein the substrate is disposed on the bottom plate, and the surrounding wall stands on the bottom plate and surrounds the substrate;
a terminal structure, comprising:
a mount assembly, assembled on the base structure, wherein the mount assembly has a plurality of accommodation slots; and
a plurality of first terminals, disposed on the mount assembly, wherein each of the plurality of first terminals comprises a connection portion, a bent portion, and a leg portion, the bent portion is connected to and located between the connection portion and the leg portion, the bent portions of the plurality of first terminals are accommodated into the plurality of accommodation slots, the connection portions of the plurality of first terminals are exposed to outside, and the leg portions of the plurality of first terminals are electrically connected to the substrate;
a second terminal, disposed on the base structure; and
a cover, disposed on the base structure and covering at least part of the plurality of first terminals and at least part of the second terminal.

6. The combined power module according to claim 5, wherein the base structure further comprises a positioning post disposed on the surrounding wall, the second terminal has a positioning hole, and the second terminal is disposed on the surrounding wall through the positioning post inserted into the positioning hole.

7. The combined power module according to claim 5, further comprising a signal terminal, wherein the base structure further comprises an installation post disposed on the surrounding wall, the signal terminal is disposed on the installation post, the cover has an installation hole, the cover is disposed on the base structure through the installation post tightly inserted into the installation hole, and the signal terminal is exposed to outside.

8. The combined power module according to claim 7, wherein the cover further has an enlargement hole connected to the installation hole, the enlargement hole is larger than the installation hole in size, the installation post is inserted into the enlargement hole, and the installation post is not in physical contact with the cover at the enlargement hole.

9. The combined power module according to claim 8, wherein the plurality of first terminals are disposed opposite to the second terminal, the cover at least partially located between the plurality of first terminals and the second terminal, and the cover has a plurality of first trenches located between the plurality of first terminals and the second terminal.

10. The combined power module according to claim 9, wherein the mount assembly has a plurality of second trenches located between the plurality of first terminals.

11. The combined power module according to claim 10, wherein a quantity of the installation post is plural, a quantity of the signal terminal is plural, and the cover has a plurality of third trenches located between the signal terminals disposed on the installation posts.

* * * * *